United States Patent [19]

Sharpe-Geisler

[11] Patent Number: 5,723,984
[45] Date of Patent: Mar. 3, 1998

[54] FIELD PROGRAMMABLE GATE ARRAY (FPGA) WITH INTERCONNECT ENCODING

[75] Inventor: Bradley A. Sharpe-Geisler, San Jose, Calif.

[73] Assignee: Advanced Micro Devices, Inc., Sunnyvale, Calif.

[21] Appl. No.: 659,279

[22] Filed: Jun. 6, 1996

Related U.S. Application Data

[60] Provisional application No. 60/000,108, Jun. 9, 1995.
[51] Int. Cl.⁶ .................... H03K 19/173; H03K 19/177
[52] U.S. Cl. ...................... 326/38; 326/41; 326/39
[58] Field of Search ........................ 326/38, 39, 41

[56] References Cited

U.S. PATENT DOCUMENTS

| Re. 34,363 | 8/1993 | Freeman . | |
|---|---|---|---|
| 4,721,868 | 1/1988 | Cornell et al. . | |
| 4,758,746 | 7/1988 | Birkner et al. . | |
| 4,818,900 | 4/1989 | Klass et al. | 326/39 |
| 5,376,844 | 12/1994 | Pedersen et al. | 326/41 |
| 5,381,058 | 1/1995 | Britton et al. | 326/41 |
| 5,485,103 | 1/1996 | Pedersen et al. | 326/41 |
| 5,486,775 | 1/1996 | Veenstra | 326/41 |
| 5,497,107 | 3/1996 | Szcepanek | 326/41 |
| 5,557,217 | 9/1996 | Pedersen | 326/41 |

*Primary Examiner*—Edward P. Westin
*Assistant Examiner*—Richard Roseen
*Attorney, Agent, or Firm*—Fliesler, Dubb, Meyer & Lovejoy, LLP

[57] ABSTRACT

A method of programing an FPGA to enable encoding of configuration logic block (CLB) outputs enabling an efficient use of FPGA routing resources. The method of the present invention utilizes the one hot approach, wherein only one CLB output is high at a time, to form a state machine using an FPGA. To provide encoding, programmable interconnect points (PIPs) may be programmed to connect CLB outputs to interconnect lines so that the interconnect lines indicate states of the CLB outputs in an encoded form. To provide such encoding, less interconnect lines than CLB outputs provide the encoded form of the CLB outputs. Thus, PIPs can connect a single interconnect line to more than one CLB output. Further, PIPs can connect a single CLB output to interconnect lines provided in separate parallel routing paths. To prevent erroneous results, CLB outputs which are not hot are tri-stated. Output decoding can be provided by an additional decoder in the FPGA connected to the interconnect lines providing the encoded form of the CLB outputs. Output decoding may alternatively be provided using a CLB.

12 Claims, 5 Drawing Sheets

FIG. 5

FIELD PROGRAMMABLE GATE ARRAY (FPGA) WITH INTERCONNECT ENCODING

CROSS-REFERENCE TO RELATED APPLICATION

This application claims the benefit of U.S. provisional Application Ser. No. 60/000,108, filed Jun. 9, 1995.

BACKGROUND OF THE INVENTION

1. Field of the Invention

The present invention relates to a method of programming a field programmable gate array (FPGA). More particularly, the present invention relates to controlling programming of programmable interconnect points (PIPs) in an FPGA to connect the outputs of configurable logic blocks (CLBs) to interconnect lines.

2. Description of the Related Art

FIG. 1 shows components of a typical FPGA 100. The typical FPGA includes input/output blocks (IOBs), an array of configurable logic blocks (CLBs), resources for interconnection of the CLBs, and a configuration memory. The IOBs are arranged around the perimeter of the device and provide an interface between internal components of the FPGA and external package pins. The CLBs are programmed to implement Boolean functions. The interconnect resources connect the CLBs and IOBs and include interconnect lines, programmable interconnect points (PIPs) and switching matrixes (SWs). The PIPs and switching matrixes connect the interconnect lines to form specific paths between CLBs, or between a CLB and an IOB. PIPs, as well as switching matrixes, are programmed to make connections by memory cells in the configuration memory.

FIG. 2 shows components of a typical CLB used in an FPGA. Each CLB utilizes a subset of memory elements in the configuration memory as a 16×1 bit look up table 200. Input lines of a CLB, $A_0$–$A3$, are decoded in the look up table 200 to select a memory cell in the look up table 200 to connect to a register 202. The register 202 provides the CLB output. By appropriately programming the look up table 200, the CLB will function as logic to implement Boolean functions.

An FPGA can be configured to form a state machine, a typical state machine being shown in block diagram in FIG. 3. In utilizing an FPGA to form a state machine, the 16×1 bit look up tables of the CLBs are configured to provide the combinatorial logic to form the next state decoder 300. The next state decoder 300 provides outputs to registers 302 which are also provided by the CLBs. To complete a state machine, outputs of the registers 302 are fed back to inputs of the next state decoder 300, and are also provided as outputs of the state machine using interconnect resources of an FPGA.

In making state machines utilizing an FPGA, the one hot approach is typically utilized. With the one hot approach, only one CLB output is high at a time. For instance, for the FPGA of FIG. 1 having 8 CLBs, to implement an 8 state state machine, the possible CLB register outputs for each of the 8 states are shown in Table A, with a 1 representing a high CLB output and a 0 representing a low CLB output.

TABLE A

|      | 1 | 2 | 3 | 4 | 5 | 6 | 7 | 8 |
|------|---|---|---|---|---|---|---|---|
| CLB0 | 1 | 0 | 0 | 0 | 0 | 0 | 0 | 0 |
| CLB1 | 0 | 1 | 0 | 0 | 0 | 0 | 0 | 0 |
| CLB2 | 0 | 0 | 1 | 0 | 0 | 0 | 0 | 0 |
| CLB3 | 0 | 0 | 0 | 1 | 0 | 0 | 0 | 0 |
| CLB4 | 0 | 0 | 0 | 0 | 1 | 0 | 0 | 0 |
| CLB5 | 0 | 0 | 0 | 0 | 0 | 1 | 0 | 0 |
| CLB6 | 0 | 0 | 0 | 0 | 0 | 0 | 1 | 0 |
| CLB7 | 0 | 0 | 0 | 0 | 0 | 0 | 0 | 1 |

FIG. 4 shows circuitry for a typical programmable array logic (PAL) device. As will be described, a typical PAL device includes a limited number of registers 400, but a wide decoding capability in comparison to a FPGA. As shown with the PAL of FIG. 4, decoding is provided utilizing combinatorial logic including AND and OR gates 402 connected to inputs of registers 400. Decoding of up to 16 inputs, 8 provided through input buffers 404 from inputs $I_0$–$I_3$ and 8 provided through buffers 406 as fed back from registers 400, is provided through the logic 402 to the input of each of the registers 400. Although FIG. 4 shows decoding of up to 16 inputs to provide a result to a single register, much wider decoding is typical in a PAL. In the FPGA of FIG. 1 with a CLB configured as shown in FIG. 2, which is typical, decoding of only 4 inputs, such as $A_0$–$A_3$ is provided by logic connected to a register, such as 202, but a total of 8 registers are available in the FPGA.

To implement a state machine using a PAL device, the wide decoding capability of the PAL is utilized to decode the next state as well as to encode the outputs. By utilizing next state decoding, as well as output encoding, an 8 state state machine can be implemented with 3 of the register outputs shown in FIG. 4. For example, with the PAL of FIG. 4, the eight possible states of flip flop outputs $O_0$–$O_2$ are shown in Table B.

TABLE B

|       | 1 | 2 | 3 | 4 | 5 | 6 | 7 | 8 |
|-------|---|---|---|---|---|---|---|---|
| $O_0$ | 0 | 1 | 0 | 1 | 0 | 1 | 0 | 1 |
| $O_1$ | 0 | 0 | 1 | 1 | 0 | 0 | 1 | 1 |
| $O_2$ | 0 | 0 | 0 | 0 | 1 | 1 | 1 | 1 |

For an FPGA, because of the limited inputs to a CLB limiting the decoding ability, output encoding is not typically performed.

To implement the one hot approach typically utilized in FPGAs in a PAL device, the additional encoding capability of the PAL would be wasted. Additionally, because of the limited number of registers, to implement the one hot approach, multiple PAL devices may be necessary. For the FPGA, a significant number of registers are available, making the one hot approach more feasible.

However, when using the one hot approach, only one CLB output is connected to an interconnect line in one routing path at a time so that separate routing paths are used for each CLB output. FIG. 1 highlights interconnect lines forming separate routing paths from CLB0 to CLB5 and from CLB1 to CLB6.

FPGAs operate faster utilizing the one hot approach because gate delays for output encoding are not required. However, limitations to enable implementation of the one hot approach may prevent the FPGA resources from being efficiently utilized to the extent that the advantages of the one hot approach are outweighed.

SUMMARY OF THE INVENTION

The present invention modifies the method of programing an FPGA to enable a user to have the option to more efficiently use FPGA interconnect resources.

The present invention is a method of programing an FPGA to enable encoding of the CLB outputs. The method of the present invention utilizes the one hot approach in forming a state machine, but modifies the typical interconnect structure of an FPGA. With the present invention, programmable interconnect points (PIPs) may be programmed to connect CLB outputs to interconnect lines so that the interconnect lines indicate states of the CLB outputs in an encoded form.

To provide such encoding, the present invention utilizes less interconnect lines than CLB outputs which are being provided in a non-encoded form. Thus, in the present invention PIPs can connect a single interconnect line to more than one CLB output. Further, PIPs can connect a single CLB output to interconnect lines provided in separate parallel routing paths.

With encoding so provided, more efficient use of the interconnect resources is enabled because the number of interconnect lines required is reduced. Also, because the number of interconnect lines is reduced, the number of SRAM cells required to connect the interconnect lines is reduced.

With the one hot approach utilized and the CLB outputs now possibly being interconnected, to prevent the hot CLB output from adversely affecting the CLB outputs which are not hot, the CLB outputs which are not hot are tri-stated.

To decode the encoded output of interconnect lines to which CLBs are connected, the present invention in one embodiment adds a decoder to typical FPGA circuitry. Alternatively, with a limited number of interconnect lines providing an encoded output, the present invention utilizes a CLB to provide decoding.

BRIEF DESCRIPTION OF THE DRAWINGS

Further details of the present invention are explained with the help of the attached drawings in which.

DETAILED DESCRIPTION

The present invention is a method of programming an FPGA to enable encoding of the CLB outputs. The programming method of the present invention allows PIPs to connect CLB outputs to interconnect lines to provide output encoding.

Figure 1:
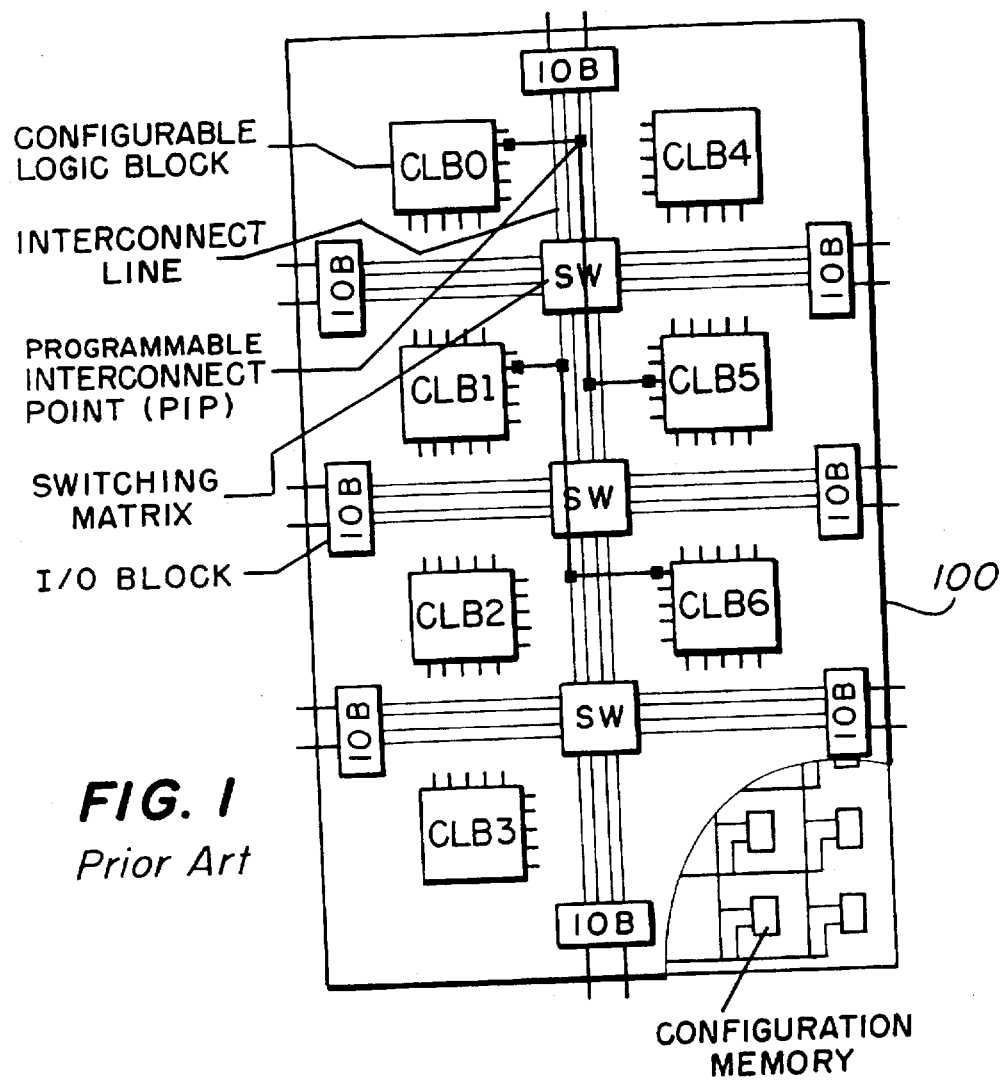
FIG. 1 shows a block diagram illustrating components of a typical FPGA.
Figure 2:
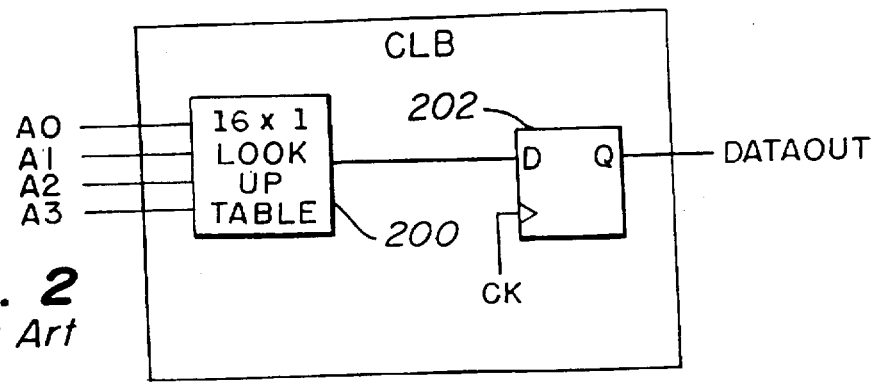
FIG. 2 shows components of a typical configurable logic block (CLB) used in an FPGA.
Figure 3:
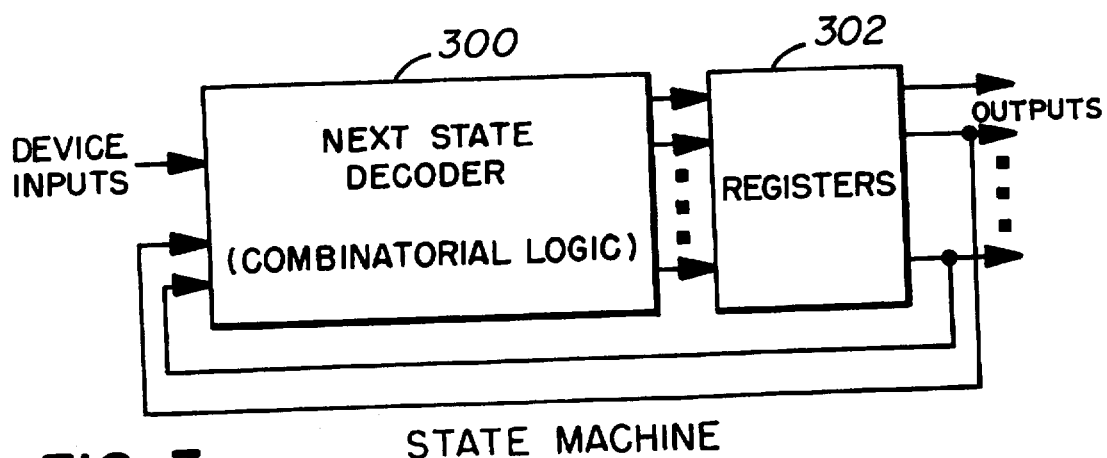
FIG. 3 shows a block diagram of a simple state machine.
Figure 4:
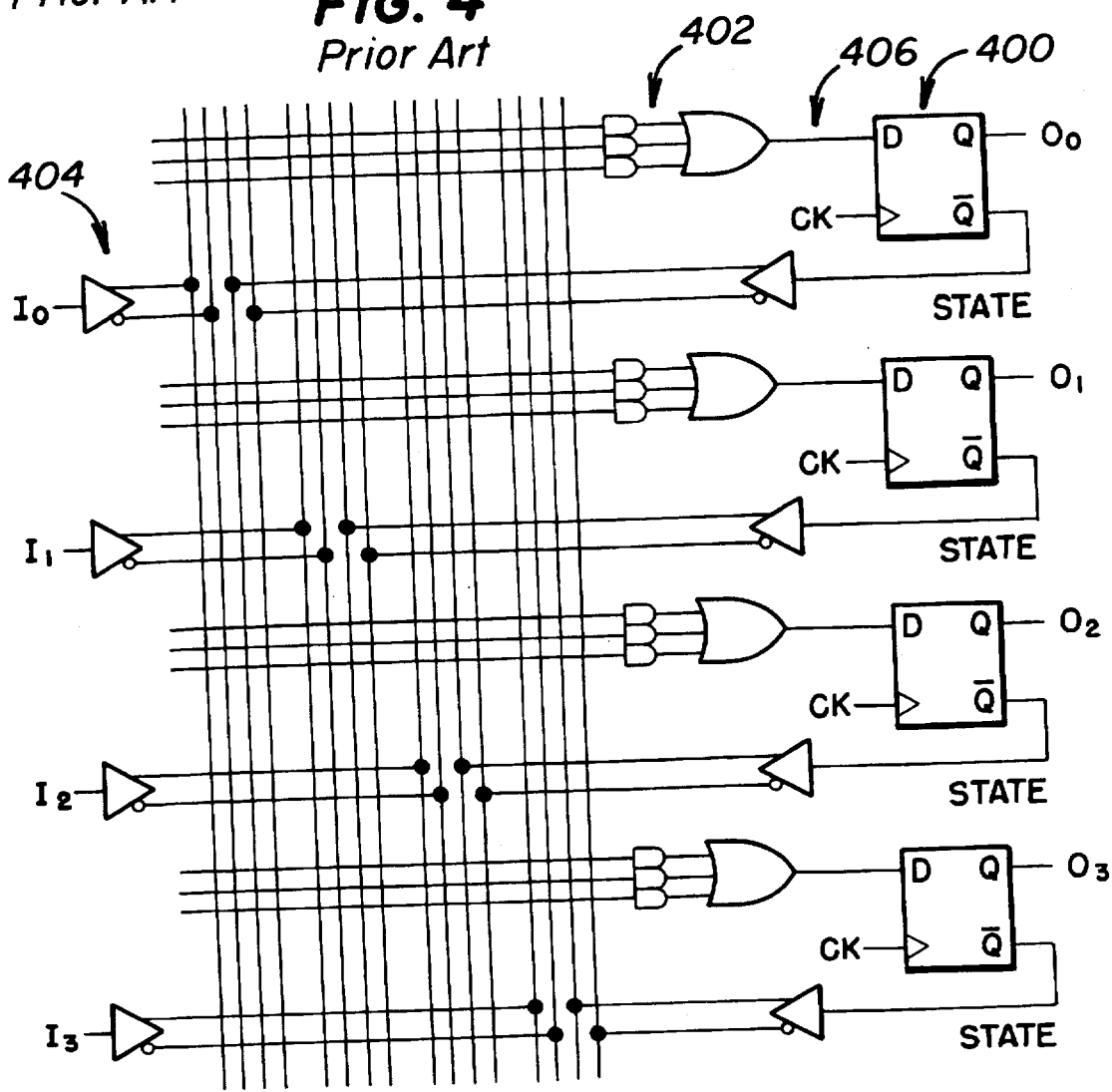
FIG. 4 shows circuitry for a typical PAL device.
Figure 5:
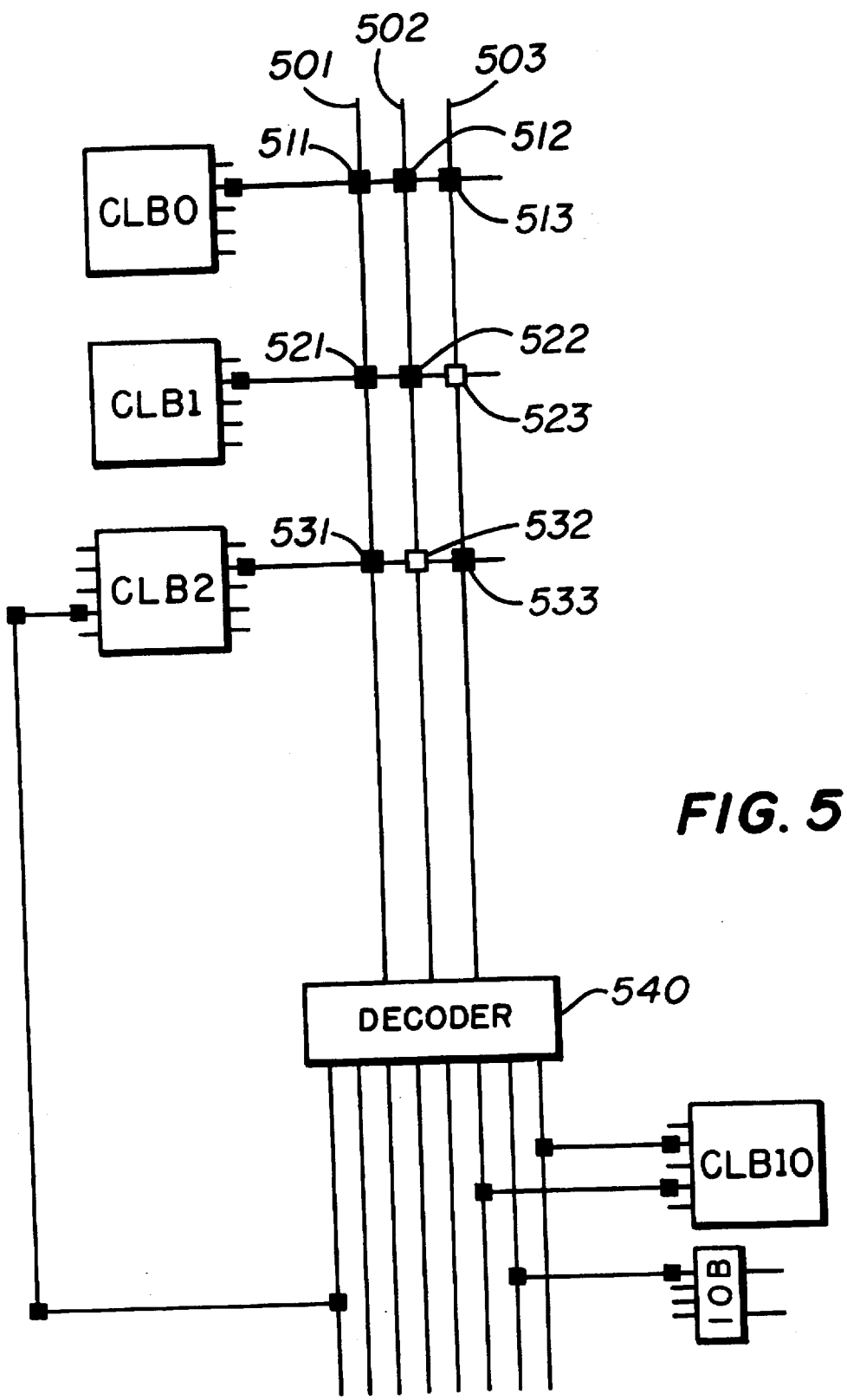
FIG. 5 illustrates the configuration of interconnect resources of an FPGA utilizing the present invention.

FIG. 5 illustrates how interconnect resources are configured utilizing the method of the present invention. In FIG. 5 CLBs of a FPGA, CLB0–CLB2, are shown each having an output connectable to interconnect lines 501, 502 and 503. Programmable interconnect points (PIPs) 511–513, 521–523, and 531–533 enable connecting the CLBs, CLB0–CLB2, to interconnect lines 501–503 to provide the encoding of the present invention.

In the present invention, PIPs 511–513, 521–523 and 531–533 are controlled to enable connecting a single one of interconnect lines 501–503 to more than one of the CLB0–CLB2 outputs. Further, a single one of the CLB0–CLB2 outputs can be connected to interconnect lines 501–503 which are provided in separate parallel routing paths.

With encoding provided as described by the present invention M CLB outputs of an M state state machine can now be represented using only $LOG_2 M$ interconnect lines, where M is an integer. For example, encoding of eight CLB outputs can be provided using three interconnect lines 501–503, as shown in FIG. 5. To illustrate, Table C below shows PIP connections of eight CLB outputs, CLB0–CLB7, to three interconnect lines, IL0–IL2. In Table C a 1 indicates a PIP connection so that a high is on the line when the CLB is high, and a 0 indicates a PIP disconnection so that a low is on the line when the CLB is high.

TABLE C

|      | IL0 | IL1 | IL2 |
|------|-----|-----|-----|
| CLB0 | 1   | 1   | 1   |
| CBL1 | 1   | 1   | 0   |
| CLB2 | 1   | 0   | 1   |
| CLB3 | 1   | 0   | 0   |
| CLB4 | 0   | 1   | 1   |
| CLB5 | 0   | 1   | 0   |
| CLB6 | 0   | 0   | 1   |
| CLB7 | 0   | 0   | 0   |

FIG. 5 shows programming similar to Table C. In FIG. 5, PIPs shown as darkened, such as 511 and 521, indicate the PIPs are programmed to create a 1 as defined for Table C, while PIPs not darkened, such as 523 and 532, indicate the PIPs are programmed to create a 0 as defined for Table C. Although shown connected in a particular manner, CLB outputs may alternatively be programmed to be connected or disconnected by any of PIPs 511–513, 521–523 and 531–533 to provide encoding.

Figure 6:
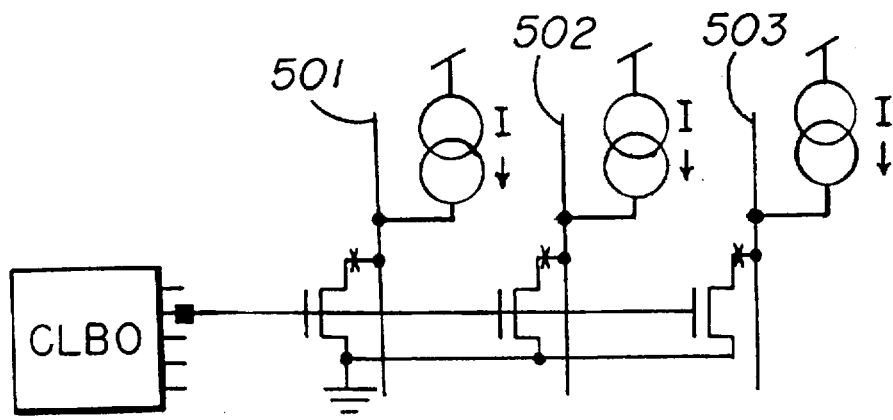
FIG. 6 shows circuitry for implementation of the possible interconnections illustrated in FIG. 5.

FIG. 6 shows circuitry for implementation of the possible interconnections illustrated in FIG. 5. As shown, a CLB output drives the gates of NMOS transistors having sources connected to Vss. Drains of the NMOS transistors driven by the CLB are then connected or disconnected to respective lines 501–503 using PIPs which are illustrated by an X in FIG. 5. Lines 501–503 are further driven by current sources.

Figure 7:
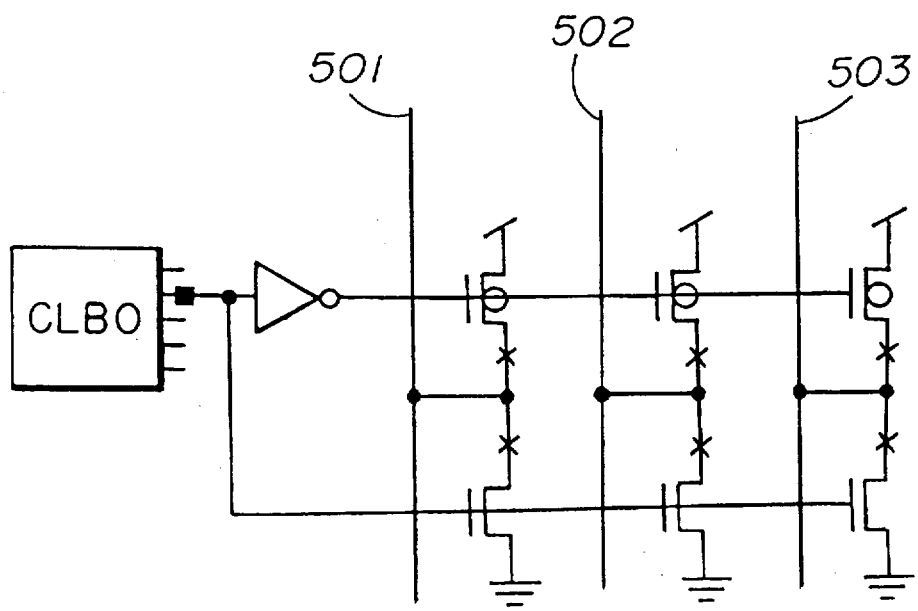
FIG. 7 shows alternative circuitry to FIG. 6 for implementation of the interconnections of FIG. 5.

FIG. 7 shows alternative circuitry to FIG. 6 for implementation of the interconnections of FIG. 5. In FIG. 7, a CLB output is provided directly to gates of NMOS transistors having sources connected to Vss. Further, the CLB output is provided through an inverter to gates of PMOS transistors having sources connected to Vdd. Drains of the PMOS transistors are then selectively connected or disconnected to respective lines 501–503 using PIPs illustrated by an X. Further, Drains of the NMOS transistors are selectively connected or disconnected to respective lines 501–503 using PIPs as shown.

Because the circuitry of FIG. 7 utilizes CMOS logic, it is faster and utilizes less power than the circuitry of FIG. 6. Further in FIG. 7 when PIPs are disconnected, the CLB output will be tri-stated, while in FIG. 6 when PIPs are disconnected, the CLB output will be open drain.

With encoding provided as described, only one CLB output which is encoded can be high at a time. For instance, referring to Table C, with CLB5 and CLB6 high, the interconnect lines would erroneously indicate that CLB4 is high. Thus, the method of the present invention utilizes the one hot approach to form a state machine.

Also with encoding provided as described above, CLB outputs may be interconnected. Even with the one hot approach, with CLB outputs interconnected a CLB output which is hot may cause CLB outputs which are not hot to change states. Therefore, in the present invention outputs of CLBs which are not hot are preferably either tri-stated or open drain.

By providing output encoding in programming an FPGA to form a state machine, more efficient use of the interconnect resources is enabled, particularly with long routing paths, because the necessary number of interconnect lines is reduced. What would otherwise require M routing paths for an M state state machine now requires only $LOG_2 M$ routing paths.

Further, with the number of interconnect lines reduced, the number of SRAM cells required for programming the interconnect lines is reduced. A FPGA may typically include 270 SRAM configuration memory cells per CLB. With 32 memory cells utilized in the CLB look up table, the remaining SRAM cells, 270−32=238, will typically be utilized for PIPs. Efficient use of the 238 SRAM cells per CLB can, thus, significantly reduce FPGA resources and, thus, the total size of an FPGA required for a particular application.

To decode the encoded lines 501–503 as provided by the present invention, one of two methods may be utilized. In a first method, a separate decoder 540 may be provided to decode the three encoded lines 501–503, as shown in FIG. 5. The output of decoder 540 can then provide eight paths. The paths from decoder 540 can then be fed back to the inputs of the CLBs, such as shown to CLB2, provided to the address inputs of additional CLBs, such as shown to CLB10, or provided to an IOB, as shown.

Figure 8:
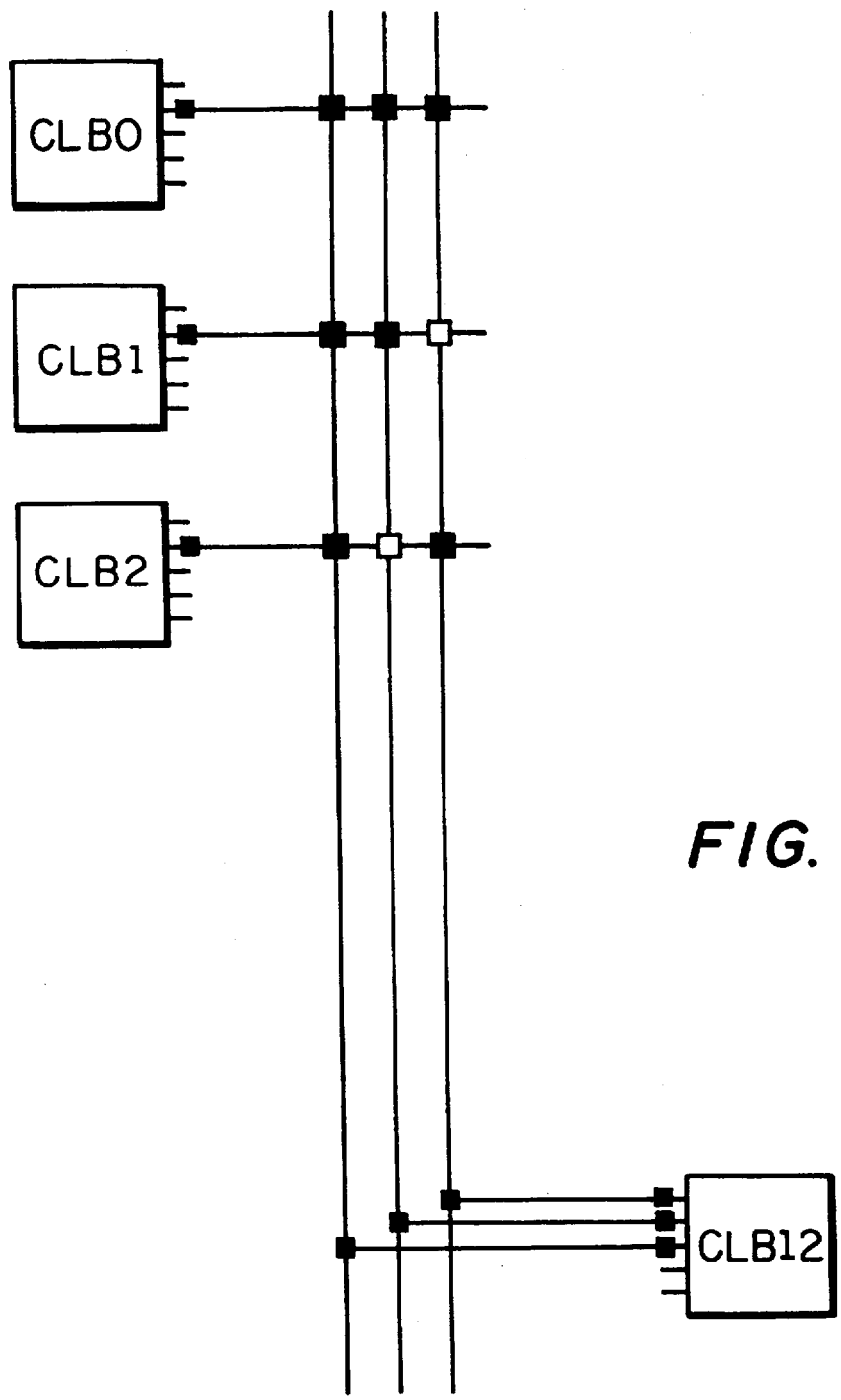
FIG. 8 illustrates decoding of encoded interconnect line outputs utilizing a CLB.

Alternatively, with a limited number of encoded lines, decoding can be provided in a CLB, such as CLB12 as shown in FIG. 8. Decoding may, however, be provided more efficiently utilizing a separate decoder, as in FIG. 5, rather than utilizing a CLB resource, as in FIG. 8, because utilization of only the decoder in the CLB may waste the remaining CLB resources.

Although the invention has been described above with particularity, this was merely to teach one of ordinary skill in the art how to make and use the invention. Many modifications will fall within the scope of the invention, as that scope is defined by the claims which follow.

What is claimed is:

1. A method of programming a field programmable gate array (FPGA) comprising the steps of:

programming configurable logic blocks (CLBs) so that only one of a number of outputs of the CLBs is high at a time; and programming programmable interconnect points to connect the outputs of the CLBs to encoding interconnect lines so that the encoding interconnect lines indicate states of the outputs of each of the CLBs in an encoded form, the encoding interconnect lines being less in number than the CLB outputs.

2. The method of claim 1 wherein when an output of one of the CLBs is high, outputs of remaining ones of the CLBs are tri-stated.

3. The method of claim 1 wherein the encoding interconnect lines are connected to the inputs of a decoder.

4. The method of claim 1 further comprising the steps of:

programming programmable interconnect points to further connect the encoding interconnect lines to inputs of an additional CLB; and programming the additional CLB to function as a decoder.

5. A method of encoding outputs of a CLB of a field programmable gate array (FPGA) comprising the steps of:

programming configurable logic blocks (CLBs) so that only one output of the CLBs is high at a time; and programming programmable interconnect points to connect more than one of the CLB outputs to a single interconnect line.

6. A method of encoding outputs of a CLB of a field programmable gate array (FPGA) comprising the steps of:

programming configurable logic blocks (CLBs) so that only one output of the CLBs is high at a time; and programming programmable interconnect points to connect one of the CLB outputs to interconnect lines provided in separate parallel routing paths.

7. A field programmable gate array (FPGA) comprising:

configurable logic blocks (CLBs) having outputs;

encoding interconnect lines; and programmable interconnect points which are controlled to be programmed to connect the outputs of the CLBs to the encoding interconnect lines so that the encoding interconnect lines indicate states of the outputs of each of the CLBs in an encoded form, wherein the encoding interconnect lines are fewer in number than the CLB outputs.

8. The FPGA of claim 7 wherein the CLBs are controlled to be programmed so that only one of the CLB outputs is high at a time.

9. The FPGA of claim 7 further comprising:

a decoder having inputs connected to the encoding interconnect lines.

10. The FPGA of claim 7 further comprising:

an additional CLB having inputs connectable to the encoding interconnect lines, the additional CLB being programmable to function as a decoder.

11. A field programmable gate array (FPGA) comprising:

configurable logic blocks (CLBs) having outputs;

interconnect lines; and programmable interconnect points which are controlled to be programmed to connect more than one of the CLB outputs to one of the interconnect lines.

12. A field programmable gate array (FPGA) comprising:

a configurable logic blocks (CLBs) having outputs;

interconnect lines; and programmable interconnect points which are controlled to be programmed to connect a one of the CLB outputs to more than one of the interconnect lines provided in separate parallel routing paths.

* * * * *